United States Patent
Park

(10) Patent No.: US 10,250,154 B2
(45) Date of Patent: Apr. 2, 2019

(54) DATA PROCESSING DEVICE AND METHOD FOR HIGH VOLTAGE DIRECT CURRENT TRANSMISSION SYSTEM

(71) Applicant: LSIS CO., LTD., Anyang-si, Gyeonggi-do (KR)

(72) Inventor: Ho Hwan Park, Suwon-si (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 422 days.

(21) Appl. No.: 14/697,439

(22) Filed: Apr. 27, 2015

(65) Prior Publication Data
US 2015/0333650 A1   Nov. 19, 2015

(30) Foreign Application Priority Data
May 14, 2014   (KR) ................. 10-2014-0058070

(51) Int. Cl.
| | | |
|---|---|---|
| G01R 21/06 | (2006.01) |
| H02M 5/44 | (2006.01) |
| G01R 19/25 | (2006.01) |
| H02J 13/00 | (2006.01) |
| H02J 3/36 | (2006.01) |
| H04Q 9/00 | (2006.01) |

(52) U.S. Cl.
CPC .......... *H02M 5/44* (2013.01); *G01R 19/2506* (2013.01); *H02J 3/36* (2013.01); *H02J 13/0003* (2013.01); *H04Q 9/00* (2013.01); Y02E 60/60 (2013.01)

(58) Field of Classification Search
CPC ............................ G01R 19/2506; H02J 3/36
USPC ........................................................ 702/62
See application file for complete search history.

(56) References Cited

U.S. PATENT DOCUMENTS

| | | | |
|---|---|---|---|
| 5,182,667 A | 1/1993 | Shibata et al. | |
| 2002/0107615 A1* | 8/2002 | Bjorklund | H02H 1/0061 |
| | | | 700/286 |
| 2008/0198037 A1* | 8/2008 | Hugelschafer | H04L 25/4904 |
| | | | 340/870.01 |

FOREIGN PATENT DOCUMENTS

| | | |
|---|---|---|
| CN | 1881744 | 12/2006 |
| CN | 101893670 | 11/2010 |
| CN | 103731209 | 4/2014 |
| GB | 1434050 | 4/1976 |

(Continued)

OTHER PUBLICATIONS

Korean Intellectual Property Office Application Serial No. 10-2014-0058070, Notice of Allowance dated Nov. 20, 2015, 5 pages.

(Continued)

*Primary Examiner* — Huan Hoang
(74) *Attorney, Agent, or Firm* — K&L Gates LLP

(57) ABSTRACT

A data processing device is provided. The data processing device in a high voltage direct current (HVDC) transmission system includes a measurement module measuring a voltage or current for one or more points in the HVDC system; and a data processing and control unit generating measurement data units using measurement values measured at the measurement module and performing serial transmission on the generated measurement data units through time division multiplexing (TDM), wherein the data processing and control unit includes a plurality of data unit generation parts, and each of the plurality of data unit generation parts outputs a transmission completion signal representing that the transmission of a measurement data unit is completed.

9 Claims, 10 Drawing Sheets

(56) References Cited

FOREIGN PATENT DOCUMENTS

| | | |
|---|---|---|
| JP | 2-244836 | 9/1990 |
| JP | 8-19168 | 1/1996 |
| JP | 11-174109 | 7/1999 |
| KR | 10-2001-0020215 | 3/2001 |
| KR | 10-2006-0083367 | 7/2006 |
| KR | 10-2012-0127531 | 11/2012 |
| KR | 10-2014-0032494 | 3/2014 |
| KR | 10-2014-0032567 | 3/2014 |

OTHER PUBLICATIONS

State Intellectual Property Office of the People's Republic of China Application Serial No. 201510246705.6, Office Action dated Mar. 7, 2017, 6 pages.
Japan Patent Office Application Serial No. 2015-098144, Office Action dated May 31, 2016, 1 page.
European Patent Office Application Serial No. 15165638.6, Search Report dated Jul. 21, 2015, 5 pages.

\* cited by examiner

CONFIGURATION OF MEASUREMENT DATA PACKET

CONFIGURATION OF MEASUREMENT DATA PACKET

DATA PROCESSING DEVICE AND METHOD FOR HIGH VOLTAGE DIRECT CURRENT TRANSMISSION SYSTEM

CROSS-REFERENCE TO RELATED APPLICATIONS

Pursuant to 35 U.S.C. § 119(a), this application claims the benefit of earlier filing date and right of priority to Korean Patent Application No. 10-2014-0058070, filed on May 14, 2014, the contents of which are hereby incorporated by reference herein in its entirety.

BACKGROUND

The present disclosure relates to a data processing device and method for a high voltage direct current (HVDC) transmission system.

According to a high voltage direct current (HVDC) transmission system, after a transmission site converts AC power produced at a power station into DC power and then transmits the DC power, a reception site re-converts DC power into AC power and then supplies power.

An HVDC system is applied to submarine cable power transmission, large-amount long-distance power transmission, interconnection between AC systems, etc. Also, the HVDC transmission system enables different frequency system interconnection and asynchronism interconnection.

The transmission site converts the AC power into the DC power. That is, since transmitting the AC power by using a submarine cable is significantly dangerous, the transmission site converts the AC power into the DC power to transmit the DC power to the reception site.

Such an HVDC transmission system controls a system by using a measurement value for a voltage/current at one or more points.

A typical HVDC transmission system has transmitted data on the measurement value through time division multiplexing (TDM). When the HVDC transmission system transmits measured data by using serial transmission through the TDM, it is possible to minimize optical cable usage but the TDM has a limitation in that it is sensitive to transmission synchronization.

Thus, there is a need for a technique which transmits measured data in order to be insensitive to the transmission synchronization even though measured data is transmitted by using the TDM.

SUMMARY

Embodiments provide a data processing device for a high voltage direct current (HVDC) transmission system insensitive to transmission synchronization.

Embodiments also provide a data processing device for the HVDC transmission system that decreases the number of cable lines and simplifies the structure of a system.

In one embodiment, a data processing device in a high voltage direct current (HVDC) transmission system includes a measurement module measuring a voltage or current for one or more points in the HVDC system; and a data processing and control unit generating measurement data units using measurement values measured at the measurement module and performing serial transmission on the generated measurement data units through time division multiplexing (TDM), wherein the data processing and control unit includes a plurality of data unit generation parts, and each of the plurality of data unit generation parts outputs a transmission completion signal representing that the transmission of a measurement data unit is completed.

Each of the plurality of data unit generation parts may output the transmission completion signal, after completing the transmission of the measurement data unit to a following data unit generation part.

The following data unit generation part may output a reception completion signal, after completing the reception of the reception of the measurement data unit.

Each of the transmission completion signal and the reception completion signal may be a signal being the basis for the generation start of the measurement data unit generated by each data unit generation part.

Each of the transmission completion signal and the reception completion signal may be a signal used for determining at which timing each data unit generation part has to insert its synchronization signal.

Each measurement data unit may include a first bit group including information identifying the measurement data unit and information on a following bit group, a second bit group representing the measurement values, and a third bit group for the error check of a measurement data unit.

The first bit group may include an identification field and a bit group information field, the identification field includes a destination identifier bit identifying a destination to which the measurement data unit is transmitted and a source identifier bit identifying who transmits the measurement data unit, and the bit group information field including information on the number of a plurality of less significant bit groups in the second bit group.

Each data unit generation part may determine the insertion time of the measurement data unit based on the information on the number of the plurality of less significant bit groups.

The third bit group may represent cyclic redundancy check (CRC).

The data processing device may further include a control unit coding a measurement data sequence serially transmitted through TDM and providing a coding result to the outside.

The details of one or more embodiments are set forth in the accompanying drawings and the description below. Other features will be apparent from the description and drawings, and from the claims.

DETAILED DESCRIPTION OF THE EMBODIMENTS

Some embodiments are described below in more detail with reference to the accompanying drawings. Noun suffixes such as "part", "module", and "unit" for components in description below are given or mixed in consideration of easiness in writing the specification. That is, the noun suffixes themselves do not have respectively distinguishable meanings or roles.

Figure 1:
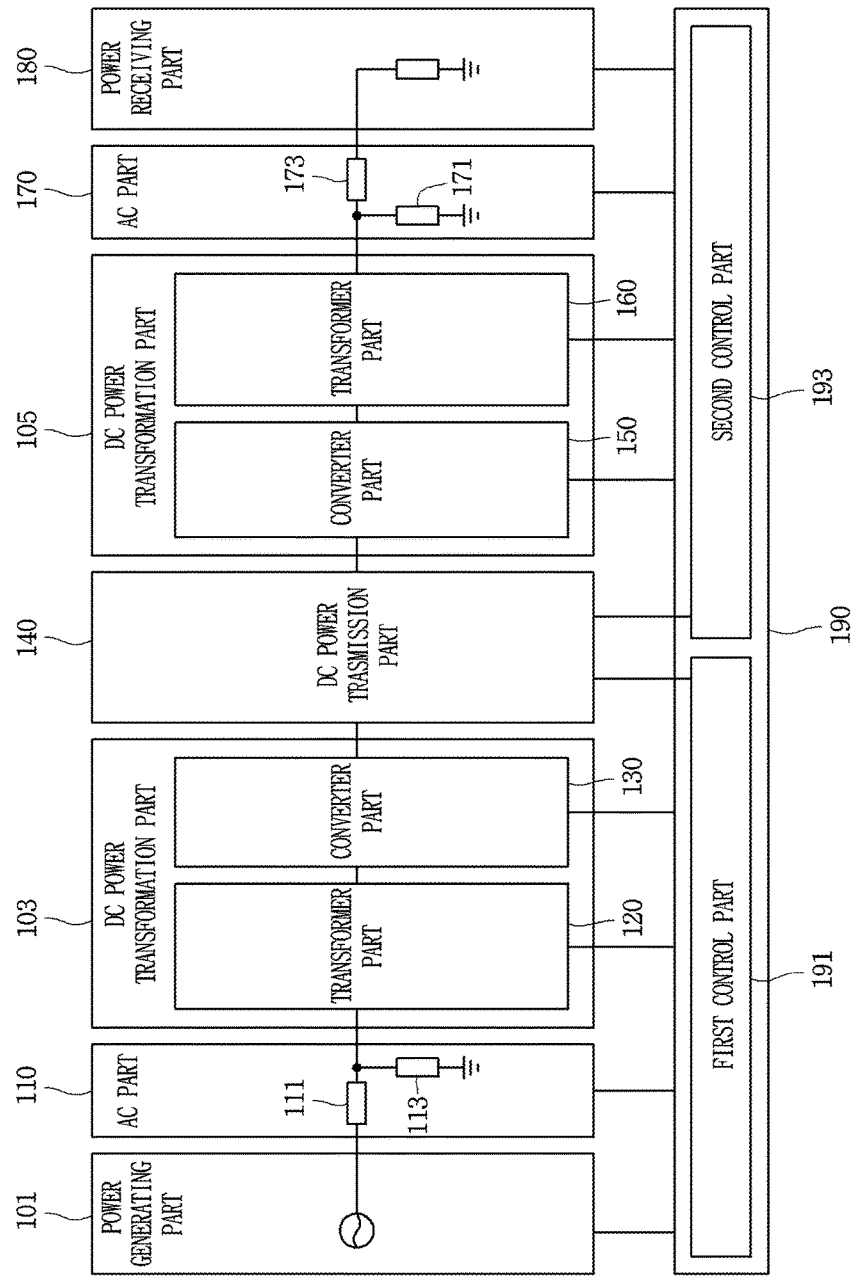
FIG. 1 shows a high voltage direct current (HVDC) transmission system according to an embodiment.

FIG. 1 shows a high voltage direct current (HVDC) transmission system according to an embodiment.

As shown in FIG. 1, an HVDC transmission system 100 according to an embodiment includes a power generation part 101, a transmission-side alternating current (AC) part 110, a transmission-side transformation part 103, a DC transmission part 140, a reception-side transformation part 105, a reception-side AC part 170, a reception part 180, and a control part 190. The transmission-side transformation part 103 includes a transmission-side transformer part 120, and a transmission-side AC/DC converter part 130. The reception-side transformation part 105 includes a reception-side AC/DC converter part 150, and a reception-side transformer part 160.

The power generation part 101 generates three-phase AC power. The power generation part 101 may include a plurality of power stations.

The transmission-side AC part 110 transmits the three-phase AC power generated by the power generation part 101 to a DC substation that includes the transmission-side transformer part 120 and the transmission-side AC/DC converter part 130.

The transmission-side transformer part 120 isolates the transmission-side AC part 110 from the transmission-side AC/DC converter part 130 and the DC transmission part 140.

The transmission-side AC/DC converter part 130 converts, into DC power, three-phase AC power corresponding to the output of the transmission-side transformer part 120.

The DC transmission part 140 transmits transmission-side DC power to a reception side.

The reception-side DC/AC converter part 150 converts DC power transmitted by the DC transmission part 140, into three-phase AC power.

The reception-side transformer part 160 isolates the reception-side AC part 170 from the reception-side DC/AC converter part 150 and the DC transmission part 140.

The reception-side AC part 170 provides, to the reception part 180, three-phase AC power corresponding to the output of the reception-side transformer part 160.

The control part 190 controls at least the power generation part 101, the transmission-side AC part 110, the transmission-side transformation part 103, the DC transmission part 140, the reception-side transformation part 105, the reception-side AC part 170, the reception part 180, the transmission-side AC/DC converter part 130, or the reception-side DC/AC converter part 150. Specifically, the control part 190 may control the turn-on and turn-off timing of a plurality of valves in the transmission-side AC/DC converter part 130 and the reception-side DC/AC converter part 150. Each of the plurality of valves may correspond to a thyristor or insulated gate bipolar transistor (IGBT).

Figure 2:
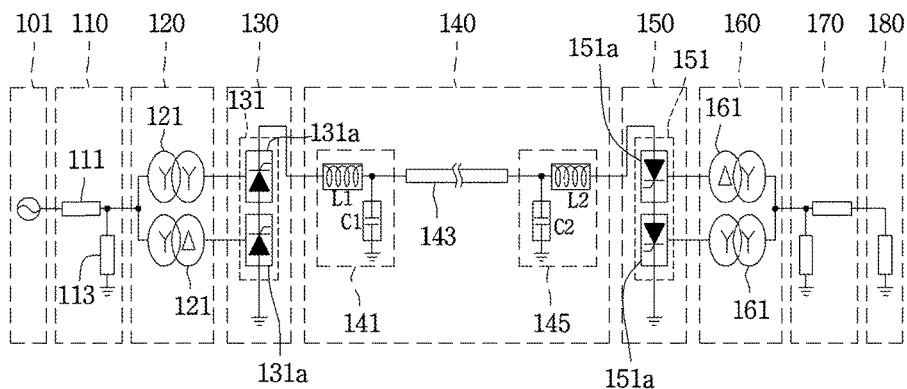
FIG. 2 shows a mono-polar HVDC transmission system according to an embodiment.

FIG. 2 shows a mono-polar HVDC transmission system according to an embodiment.

In particular, FIG. 2 shows a system transmitting single pole DC power. Although it is assumed in the following description that the single pole is a positive pole, there is no need to be limited thereto.

A transmission-side AC part 110 includes an AC transmission line 111 and an AC filter 113.

The AC transmission line 111 transmits three-phase AC power generated by the power generation part 101, to the transmission-side transformation part 103.

The AC filter 113 removes other frequency components excluding frequency components used by the transformation part 103, from the transmitted three-phase AC power.

The transmission-side transformer part 120 includes one or more transformers 121 for the positive pole. For the positive pole, the transmission-side AC-DC converter part 130 includes an AC/positive-pole DC converter 131 generating positive-pole DC power, and the AC/positive-pole DC converter 131 includes one or more three-phase valve bridges 131a corresponding to the one or more transformers 121, respectively.

When one three-phase bridge 131a is used, the AC/positive-pole DC converter 131 may use AC power to generate positive-pole DC power having six pulses. In this case, the primary and secondary coils of the transformer 121 may have a Y-Y connection or Y-Δ connection.

When two three-phase valve bridges 131a are used, the AC/positive-pole DC converter 131 may use AC power to generate positive-pole DC power having twelve pulses. In this case, the primary and secondary coils of one of two transformers 121 may have a Y-Y connection, and the primary and secondary coils of the other of two transformers 121 may have a Y-Δ connection.

When three three-phase valve bridges 131a are used, the AC/positive-pole DC converter 131 may use AC power to generate positive-pole DC power having eighteen pulses. The more the number of pulses of the positive-pole DC power, the price of the filter may decrease.

The DC transmission part 140 includes a transmission-side positive-pole DC filter 141, a positive-pole DC transmission line 143, and a reception-side positive-pole DC filter 145.

The transmission-side positive-pole DC filter 141 includes an inductor L1 and a capacitor C1 and DC-filters positive-pole DC power output by the AC/positive-pole DC converter 131.

The positive-pole DC transmission line 143 may have one DC line for transmission of positive-pole DC power, and earth may be used as a current feedback path. One or more switches may be disposed on the DC line.

The reception-side positive-pole DC filter 145 includes an inductor L2 and a capacitor C2 and DC-filters positive-pole DC power transmitted through the positive-pole DC transmission line 143.

The reception-side DC/AC converter part 150 includes a positive DC/AC converter 151, which includes one or more three-phase valve bridges 151*a*.

The reception-side transformer part 160 includes one or more transformers 161 corresponding respectively to one or more three-phase valve bridges 151*a* for the positive pole.

When one three-phase valve bridge 151*a* is used, the positive-pole DC/AC converter 151 may use positive-pole DC power to generate AC power having six pulses. In this case, the primary and secondary coils of the transformer 161 may have a Y-Y connection or Y-Δ connection.

When two three-phase valve bridges 151*a* are used, the positive-pole DC/AC converter 151 may use positive-pole DC power to generate AC power having twelve pulses. In this case, the primary and secondary coils of one of two transformers 161 may have a Y-Y connection, and the primary and secondary coils of the other of two transformers 161 may have a Y-Δ connection.

When three three-phase valve bridges 151*a* are used, the positive-pole DC/AC converter 151 may use positive-pole DC power to generate AC power having eighteen pulses. The more the number of pulses of the AC power, the price of the filter may decrease.

A reception-side AC part 170 includes an AC filter 171 and an AC transmission line 173.

The AC filter 171 removes other frequency components excluding the frequency component (e.g., about 60 Hz) used by the reception part 180, from the AC power generated by the reception-side transformation part 105.

The AC transmission line 173 transmits filtered AC power to the reception part 180.

Figure 3:
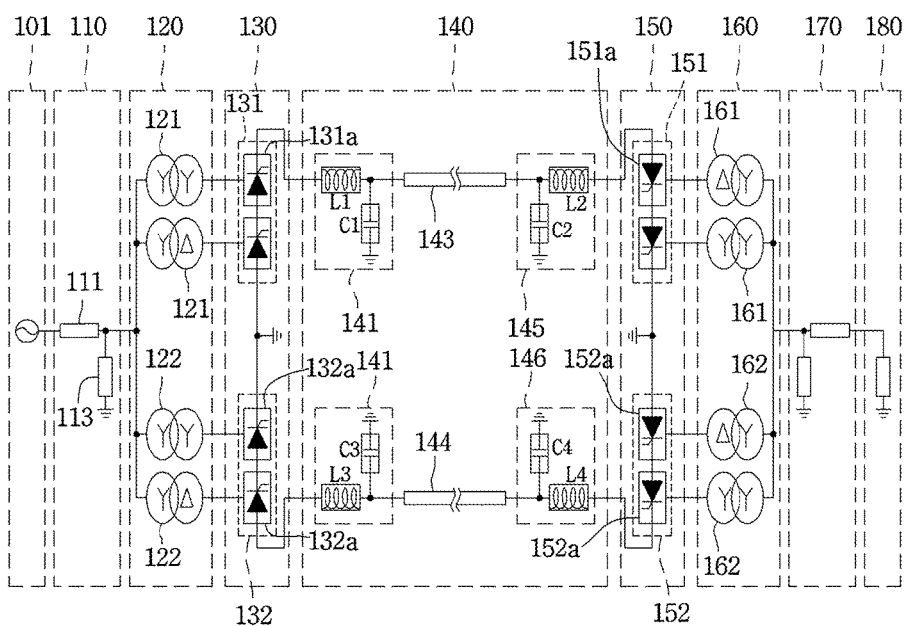
FIG. 3 shows a bipolar HVDC transmission system according to an embodiment.

FIG. 3 shows a bipolar HVDC transmission system according to an embodiment.

In particular, FIG. 3 shows a system transmitting two-pole DC power. Although it is assumed in the following description that the two poles are a positive pole and a negative pole, there is no need to be limited thereto.

A transmission-side AC part 110 includes an AC transmission line 111 and an AC filter 113.

The AC transmission line 111 transmits three-phase AC power generated by the power generation part 101, to the transmission-side transformation part 103.

The AC filter 113 removes other frequency components excluding frequency components used by the transformation part 103, from the transmitted three-phase AC power.

The transmission-side transformer part 120 includes one or more transformers 121 for the positive pole and one or more transformers 122 for the negative pole. A transmission-side AC/DC converter part 130 includes an AC/positive-pole DC converter 131 generating positive-pole DC power and an AC/negative-pole DC converter 132 generating negative-pole DC power, the AC/positive-pole DC converter 131 includes one or more three-phase valve bridges 131*a* corresponding respectively to one or more transformers 121 for the positive-pole, and the AC/negative-pole DC converter 132 includes one or more three-phase valve bridges 132*a* corresponding respectively to one or more transformers 122 for the negative-pole.

When one three-phase valve bridge 131*a* is used for the positive pole, the AC/positive-pole DC converter 131 may use AC power to generate positive-pole DC power having six pulses. In this case, the primary and secondary coils of the transformer 121 may have a Y-Y connection or Y-Δ connection.

When two three-phase bridges 131*a* are used for the positive pole, the AC/positive-pole DC converter 131 may use AC power to generate positive-pole DC power having twelve pulses. In this case, the primary and secondary coils of one of two transformers 121 may have a Y-Y connection, and the primary and secondary coils of the other of two transformers 121 may have a Y-Δ connection.

When three three-phase bridges 131*a* are used for the positive pole, the AC/positive-pole DC converter 131 may use AC power to generate positive-pole DC power having eighteen pulses. The more the number of pulses of the positive-pole DC power, the price of the filter may decrease.

When one three-phase bridge 132*a* is used for the negative pole, the AC/negative-pole DC converter 132 may generate negative-pole DC power having six pulses. In this case, the primary and secondary coils of the transformer 122 may have a Y-Y connection or Y-Δ connection.

When two three-phase bridges 132*a* are used for the negative pole, the AC/negative-pole DC converter 132 may generate negative-pole DC power having twelve pulses. In this case, the primary and secondary coils of one of two transformers 122 may have a Y-Y connection, and the primary and secondary coils of the other of two transformers 122 may have a Y-Δ connection.

When three three-phase bridges 132*a* are used for the negative pole, the AC/negative-pole DC converter 132 may generate negative-pole DC power having eighteen pulses. The more the number of pulses of the negative-pole DC power, the price of the filter may decrease.

The DC transmission part 140 includes a transmission-side positive-pole DC filter 141, a transmission-side negative-pole DC filter 142, a positive-pole DC transmission line 143, a negative-pole DC transmission line 144, a reception-side positive-pole DC filter 145, and a reception-side negative-pole DC filter 146.

The transmission-side positive-pole DC filter 141 includes an inductor L1 and a capacitor C1 and DC-filters positive-pole DC power output by the AC/positive-pole DC converter 131.

The transmission-side negative-pole DC filter 142 includes an inductor L3 and a capacitor C3 and DC-filters negative-pole DC power output by the AC/negative-pole DC converter 132.

The positive-pole DC transmission line 143 may have one DC line for transmission of positive-pole DC power, and earth may be used as a current feedback path. One or more switches may be disposed on the DC line.

The negative-pole DC transmission line 144 may have one DC line for transmission of negative-pole DC power, and earth may be used as a current feedback path. One or more switches may be disposed on the DC line.

The reception-side positive-pole DC filter 145 includes an inductor L2 and a capacitor C2 and DC-filters positive-pole DC power transmitted through the positive-pole DC transmission line 143.

The reception-side negative-pole DC filter 146 includes an inductor L4 and a capacitor C4 and DC-filters negative-pole DC power transmitted through the negative-pole DC transmission line 144.

The reception-side DC-AC converter part 150 includes a positive-pole DC/AC converter 151 and a negative-pole DC/AC converter 152, the positive-pole DC/AC converter 151 includes one or more three-phase valve bridges 151*a*, and the negative-pole DC/AC converter 152 includes one or more three-phase valve bridges 152*a*.

The reception-side transformer part 160 includes one or more transformers 161 corresponding respectively to one or more three-phase valve bridges 151*a* for the positive pole, and one or more transformers 162 corresponding respectively to one or more three-phase valve bridges 152*a* for the negative pole.

When one three-phase valve bridge 151*a* is used for the positive pole, the positive-pole DC/AC converter 151 may use positive-pole DC power to generate AC power having six pulses. In this case, the primary and secondary coils of the transformer 161 may have a Y-Y connection or Y-Δ connection.

When two three-phase valve bridges 151*a* are used for the positive pole, the positive-pole DC/AC converter 151 may use positive-pole DC power to generate AC power having twelve pulses. In this case, the primary and secondary coils of one of two transformers 161 may have a Y-Y connection, and the primary and secondary coils of the other of two transformers 161 may have a Y-Δ connection.

When three three-phase valve bridges 151*a* are used for the positive pole, the positive-pole DC/AC converter 151 may use positive-pole DC power to generate AC power having eighteen pulses. The more the number of pulses of the AC power, the price of the filter may decrease.

When one three-phase valve bridge 152*a* is used for the negative pole, the negative-pole DC/AC converter 152 may use negative-pole DC power to generate AC power having six pulses. In this case, the primary and secondary coils of the transformer 162 may have a Y-Y connection or Y-Δ connection.

When two three-phase valve bridges 152*a* are used for the negative pole, the negative-pole DC/AC converter 152 may use negative-pole DC power to generate AC power having twelve pulses. In this case, the primary and secondary coils of one of two transformers 162 may have a Y-Y connection, and the primary and secondary coils of the other of two transformers 162 may have a Y-Δ connection.

When three three-phase valve bridges 152*a* are used for the negative pole, the negative-pole DC/AC converter 152 may use negative-pole DC power to generate AC power having eighteen pulses. The more the number of pulses of the AC power, the price of the filter may decrease.

A reception-side AC part 170 includes an AC filter 171 and an AC transmission line 173.

The AC filter 171 removes other frequency components excluding the frequency component (e.g., about 60 Hz) used by the reception part 180, from the AC power generated by the reception-side transformation part 105.

The AC transmission line 173 transmits filtered AC power to the reception part 180.

Figure 4:
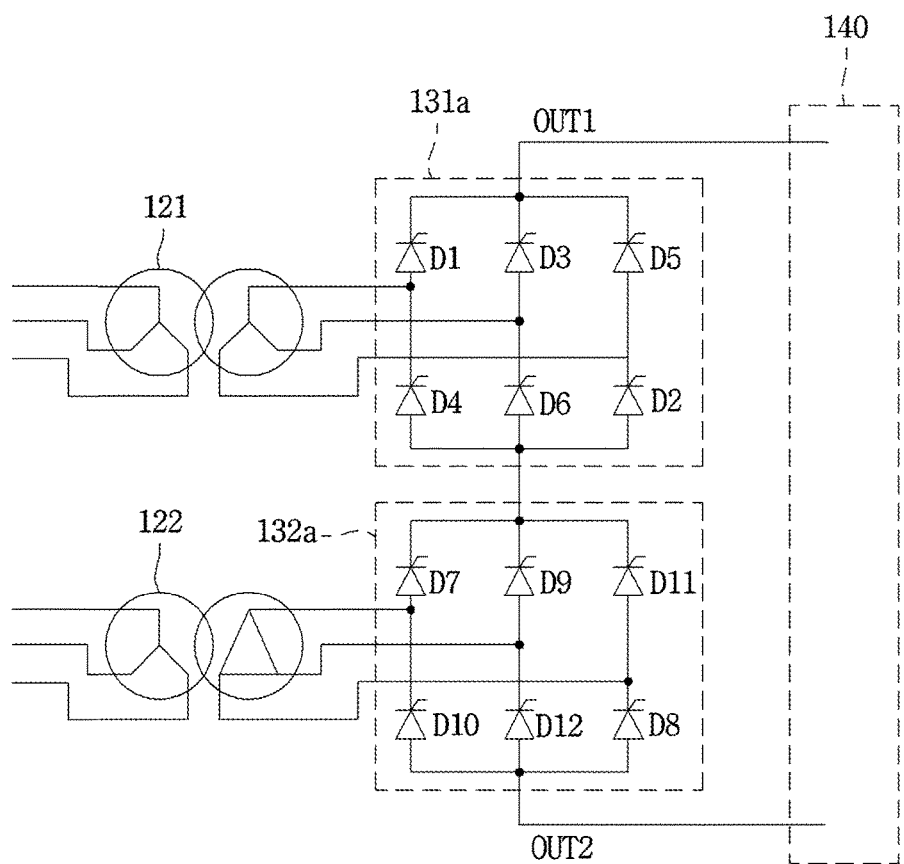
FIG. 4 shows the connection of a three-phase valve bridge and a transformer according to an embodiment.

FIG. 4 shows the connection of a three-phase valve bridge and a transformer according to an embodiment.

In particular, FIG. 4 shows the connection of two transformers 121 for a positive pole and two three-phase valve bridges 131*a* for the positive pole. Since the connection of two transformers 122 for a negative pole and two three-phase valve bridges 132*a* for the negative pole, the connection of two transformers 161 for the positive pole and two three-phase valve bridges 151*a* for the positive pole, the connection of two transformers 162 for the negative pole and two three-phase valve bridges 152*a* for the negative pole, the connection of a transformer 121 for the positive pole and a three-phase valve bridge 131*a* for the positive pole, the connection of a transformer 161 for the positive pole and a three-phase valve bridge 151*a* for the positive pole and so on may be easily driven from FIG. 4, their drawings and descriptions are omitted.

In FIG. 4, the transformer 121 having a Y-Y connection is referred to as an upper transformer, the transformer 121 having a Y-Δ connection is referred to as a lower transformer, the three-phase valve bridge 131*a* connected to the upper transformer is referred to as an upper three-phase valve bridge, and the three-phase valve bridge 131*a* connected to the lower transformer is referred to as a lower three-phase valve bridge.

The upper three-phase valve bridge and the lower three-phase valve bridge have a first output OUT1 and a second output OUT2 that are two outputs outputting DC power.

The upper three-phase valve bridge includes six valves D1 to D6 and the lower three-phase valve bridge includes six valves D7 to D12.

The valve D1 has a cathode connected to the first output OUT1 and an anode connected to a first terminal of the secondary coil of the upper transformer.

The valve D2 has a cathode connected to the anode of the valve D5 and an anode connected to the anode of the valve D6.

The valve D3 has a cathode connected to the first output OUT1 and an anode connected to a second terminal of the secondary coil of the upper transformer.

The valve D4 has a cathode connected to the anode of the valve D1 and an anode connected to the anode of the valve D6.

The valve D5 has a cathode connected to the first output OUT1 and an anode connected to a third terminal of the secondary coil of the upper transformer.

The valve D6 has a cathode connected to the anode of the valve D3.

The valve D7 has a cathode connected to the anode of the valve D6 and an anode connected to a first terminal of the secondary coil of the lower transformer.

The valve D8 has a cathode connected to the anode of the valve D11 and an anode connected to the second output OUT2.

The valve D9 has a cathode connected to the anode of the valve D6 and an anode connected to a second terminal of the secondary coil of the lower transformer.

The valve D10 has a cathode connected to the anode of the valve D7 and an anode connected to the second output OUT2.

The valve D11 has a cathode connected to the anode of the valve D6 and an anode connected to the third terminal of the secondary coil of the lower transformer.

The valve D12 has a cathode connected to the anode of the valve D9 and an anode connected to the second output OUT2.

Figure 5:
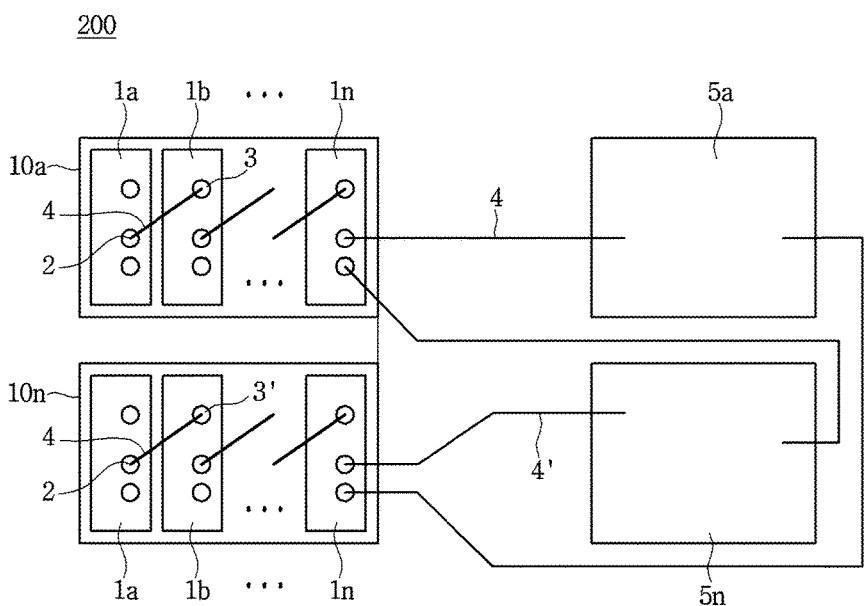
FIG. 5 is a diagram for explaining the configuration of a data processing device according to an embodiment.

FIG. 5 is a diagram for explaining the configuration of a data processing device according to an embodiment.

Referring to FIG. 5, a data processing device 200 includes a plurality of pre-processing groups 10*a* to 10*n* and a plurality of control units 5*a* to 5*n*.

The data processing device 200 may be included in the control part 190 of the HVDC transmission system in FIG. 1.

Each of the plurality of pre-processing groups 10*a* to 10*n* may include a plurality of pre-processing groups. The plurality of pre-processing groups 10*a* to 10*n* may correspond to the plurality of control units, respectively.

The output terminal of each of the plurality of pre-processing units 1*a* to 1*n* in a first pre-processing group 10*a* may be connected to the input terminal of the following pre-processing unit through an optical waveguide 4. Each of the plurality of pre-processing units 1a to 1n may transmit data to the input terminal of the following pre-processing unit through an output terminal 2.

The pre-processing unit 1n disposed at the very end may be connected to the control unit 5a through the optical waveguide 4.

The plurality of pre-processing units 1a to 1n may be connected to various measurement units (not shown).

The plurality of pre-processing units 1a to 1n may pre-process measurement values measured at the measurement unit, convert the values and transmit converted values to the plurality of control units 5a to 5n, respectively.

A first pre-processing unit 1a pre-processes the measurement value received from the measurement unit and outputs first pre-processed data.

The first pre-processed data output from the output terminal 2 of the first pre-processing unit 1a is transmitted to the input terminal 3 of the second pre-processing unit 1b through the optical waveguide 4. The first pre-processed data transmitted through the input terminal 3 of a second pre-processing unit 1b is transmitted to the input terminal of the following pre-processing unit along with second pre-processed data from the second pre-processing unit 1b. The pre-processed data received from the nth pre-processing unit 1n disposed at the very end is transmitted to the control unit 5a.

The plurality of control units 5a to 5n receive pre-processed data from the plurality of pre-processing groups, respectively.

Each of the plurality of control units 5a to 5n may code received pre-processed data and transmit coded data to the outside.

Figure 6:
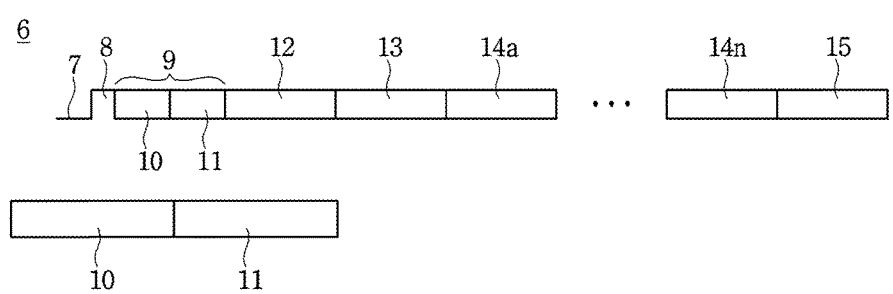
FIG. 6 is a diagram for explaining timing at which data is transmitted from each pre-processing unit according to an embodiment.

FIG. 6 is a diagram for explaining timing at which data is transmitted from each pre-processing unit according to an embodiment.

Referring to FIG. 6, a data word 6 starts from a synchronization signal 7 to which a start bit 8 is attached. A plurality of bit groups 9 to 14n and a check bit group 15 may be disposed behind the start bit 8.

A first bit group 9 may include two bit group elements 10 and 11. Each of the two bit group elements 10 and 11 has an 8-bit length.

A first bit group element 10 includes a bit sequence identifying each pre-processing unit. A second bit group element 11 includes information on a plurality of bit groups 12 to 15 following the first bit group 9. The plurality of bit groups 12 to 15 correspond to a plurality of measurement values, and state and check bit groups.

A second bit group 12 and a third bit group 13 include state information on measurement values measured from the measurement unit. The state information on the measurement values may be state information on the measurement values generated at the pre-processing unit. The state information on the measurement values may include information on the validity of the measurement values and information on whether a pre-processing has been performed.

The plurality of bit groups 14a to 14n flowing a third bit group 13 corresponds to the plurality of measurement values generated at the pre-processing unit, respectively.

The check bit group 15 following the plurality of bit groups 14a to 14n may be used to check whether data to be transmitted by using the data word 6 may be reliable data.

Figure 7:
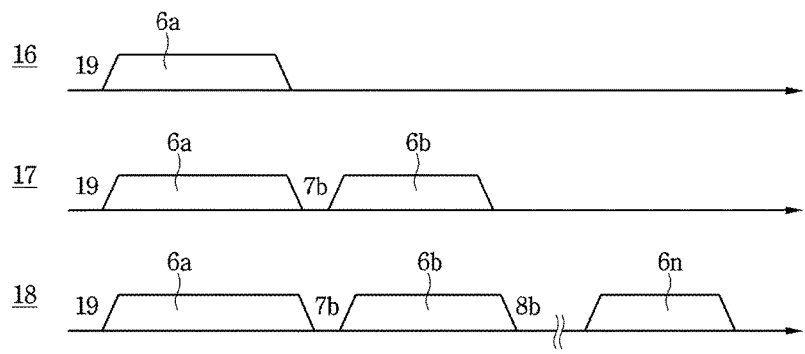
FIG. 7 shows data records having data words from each pre-processing unit according to an embodiment.

FIG. 7 shows data records having data words from each pre-processing unit according to an embodiment.

Referring to FIG. 7, each of the plurality of data words 6a to 6n corresponds to the data word in FIG. 6.

A first data record 16 includes a first data word 6a output from the first pre-processing unit 1a in FIG. 5.

A second data record 17 includes the first data word 6a and a second data word 6b output from the second pre-processing unit 1b in FIG. 5.

An nth data record 18 includes data words 6a to 6n output from the plurality of pre-processing units 1a to 1n.

The first pre-processing unit 1a may be used as a master and start data transmission by using a master synchronization signal 19.

The first pre-processing unit 1a transmits the first data word 6a having a format as shown in FIG. 6, after generating the master synchronization signal 19. As described in FIG. 6, the first data word 6a includes the second bit group element 11 including information on the number of the plurality of bit groups 12 to 15 following the first bit group 9.

The information on the number of the plurality of bit groups 12 to 15 may be used for determining an insertion time representing at which timing the second pre-processing unit 1b inserts its own synchronization signal 7b and the second data word 6b behind the first data word 6a. With the determination of the insertion time, the second data record 17 may be generated.

Each of the following pre-processing units may insert its synchronization signal and a data word to generate a data record in this way. Finally, an nth data record 18 may be generated.

Data output from the nth pre-processing unit 1n may be transmitted to the control unit 5 through the optical waveguide 4. The control unit 5 may perform an additional processing on the data output from the nth pre-processing unit 1n.

Figure 8:
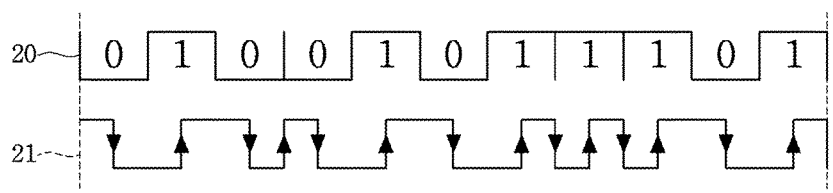
FIG. 8 is a diagram for explaining the process of coding measurement data according to an embodiment.

FIG. 8 is a diagram for explaining the process of coding measurement data according to an embodiment.

Each of the plurality of control units in FIG. 5 may use bi-phase coding to code each of the measurement values of the pre-processing units.

When the bi-phase coding is used, a measurement value may be expressed by 0 representing a low signal and 1 representing a high signal. The bi-phase coding does not permit a continuous low or high state in one data word.

Referring to FIG. 8, measurement data 20 representing a measurement value includes low signals and high signals. The control unit may code the measurement data 20 through the bi-phase coding and generate a coded transmission signal 21. The coded transmission signal 21 does not have a continuous low signal and a continuous high signal. Such coding allows a synchronization signal to be clearly represented on the transmission signal 21. In an embodiment, the master synchronization signal 19 generated at the first pre-processing unit 1a may be expressed so that 13 low signals are continuously represented, and each of synchronization signals 7b to 7n generated from remaining pre-preprocessing units excluding the first pre-processing unit 1a may be expressed so that 7 low signals are continuously represented.

Next, FIGS. 9 to 12 are described.

In FIGS. 9 to 12, the data transmission between components may be performed based on wavelength division multiplexing (WDM). The WDM indicates communicating a plurality of wavelengths through one optical fiber.

Figure 9:
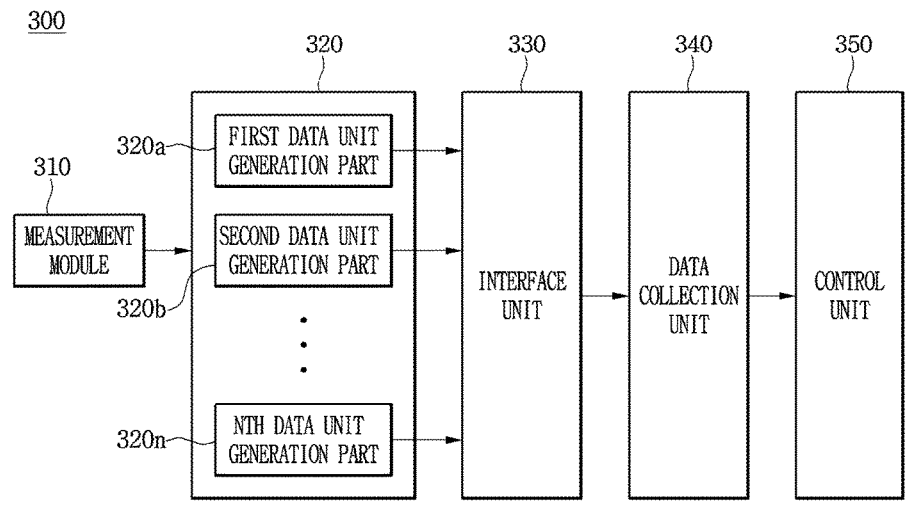
FIG. 9 is a block diagram of a data processing device according to another embodiment and FIG. 10 shows the actual configuration of a data processing device according to another embodiment.
Figure 10:
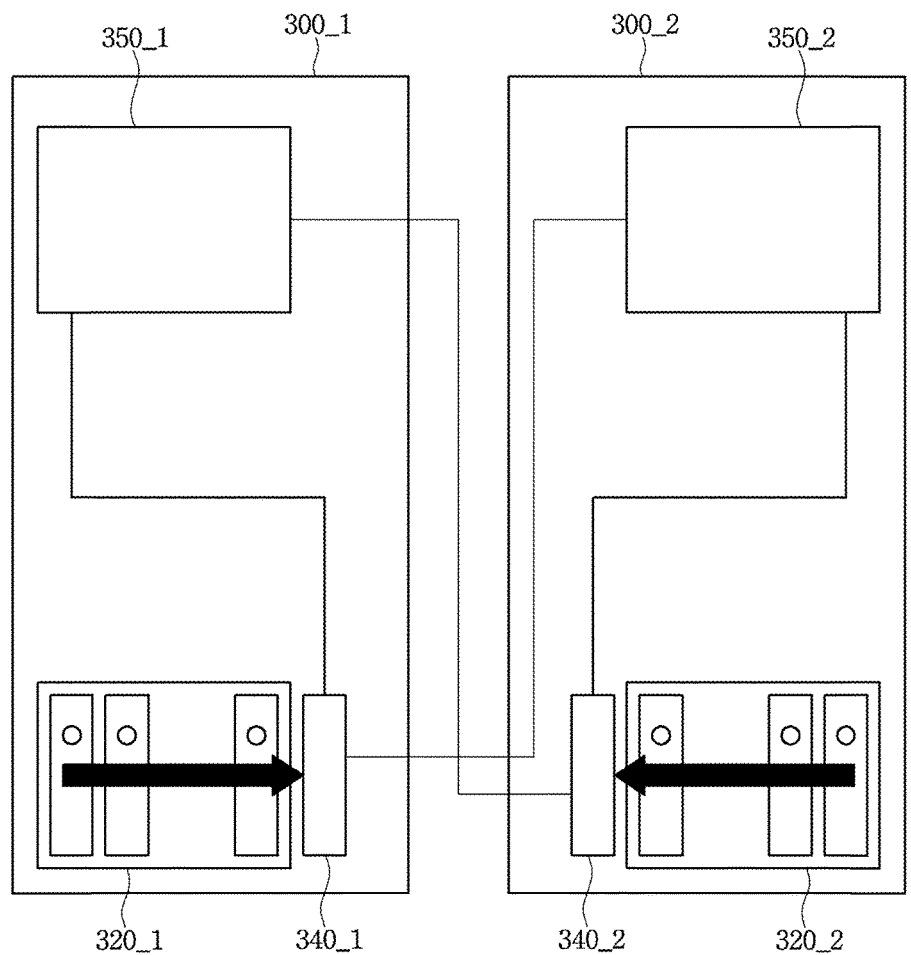

FIGS. 9 and 10 are diagrams for explaining the data processing device of an HVDC transmission system according to another embodiment.

FIG. 9 is a block diagram of a data processing device according to another embodiment and FIG. 10 shows the actual configuration of a data processing device according to another embodiment.

A data processing device 300 may be included in the control part 190 in FIG. 1, but the inventive concept has no need to be limited thereto and the data processing device may be a separate means.

Referring to FIG. 9, the data processing device 300 includes a measurement module 310, a data generation unit 320, an interface unit 330, a data collection unit 340, and a control unit 350.

The measurement module 310 obtains measurement values for one or more points in the HVDC transmission system. In an embodiment, the measurement module 310 may obtain measurement values for any one point in the HVDC transmission system in FIGS. 1 and 2. The measurement values may include an AC voltage for a point in the AC parts 110 and 170 and an AC current for a point in the AC parts 110 and 170. Also, the measurement values may include a DC voltage of the DC transmission part 140 and a DC current for a point in the DC transmission part 140. However, the inventive concept has no need to be limited thereto and the measurement values may include the voltage/current of the input or output terminal of a component configuring the HVDC transmission system.

The data generation unit 320 uses the measurement values obtained from the measurement module 310 to generate a measurement data unit. The data generation unit 320 may include a plurality of data unit generation parts 320a to 320n, and each of the plurality of data unit generation parts 320a to 320n may use measurement values obtained from the measurement module 310 to generate a measurement data unit. Each of the data unit generation parts 320a to 320n may pre-process measurement values received from the measurement module 310. Each of the plurality of data unit generation parts 320a to 320n may perform a preliminary process of removing unnecessary information from the measurement values so that the control unit 350 extracts valid values for the measurement values. Each of the plurality of data unit generation parts 320a to 320n may perform a preprocessing to generate a measurement data unit.

Each of the plurality of data unit generation parts 320a to 320n may transmit to the data collection unit 340 a measurement data unit pre-processed through the interface unit 330.

The interface unit 330 transmits, a plurality of measurement data units generated respectively from the plurality of data unit generation parts 320a to 320n, to the data collection unit 340.

The interface unit 330 transmits, the plurality of measurement data units generated respectively from the plurality of data unit generation parts 320a to 320n, to the data collection unit 340 in parallel.

The interface unit 330 may use a backplane bus specification to transmit the measurement data unit generated from each of the plurality of data unit generation parts 320a to 320n to the data collection unit 340. The interface unit 330 may connect the plurality of data unit generation parts 320a to 320n and the data collection unit 320 to function as a path for the transmission of the measurement data unit.

The data collection unit 340 collects the plurality of measurement data units transmitted through the interface unit 330.

In an embodiment, the data collection unit 340 may collect the plurality of measurement data units transmitted through the interface unit 330 simultaneously. That is, the data collection unit 340 may simultaneously collect the plurality of measurement data units through the backplane bus specification.

The data collection unit 340 may function as a buffer. That is, the data collection unit 340 may be utilized as a temporary storage temporarily storing data when data is transmitted and received between the plurality of data unit generation parts 320a to 320n and the control unit 350.

The data collection unit 340 may be named a gate module.

The data collection unit 340 generates a measurement data packet based on the plurality of measurement data units collected.

In an embodiment, the data collection unit 340 may use a plurality of measurement data units to generate one measurement data packet.

The data collection unit 340 may code a generated measurement data packet to generate a coded measurement data packet. The data collection unit 340 may code each of the plurality of measurement data units and use a coding result to generate one measurement data packet.

The data collection unit 340 transmits the generated data packet to the control unit 350.

The control unit 350 provides the received measurement data packet to the outside based on a trigger.

The trigger may be a motive for initiating the transmission of the measurement data packet.

In an embodiment, the trigger may be generated at regular time intervals. That is, the control unit 350 may provide the measurement data packet to the outside at defined time intervals.

In another embodiment, the trigger may be generated at irregular time intervals. The control unit 350 may provide the measurement data packet to the outside at irregular time intervals.

In another embodiment, the trigger may be a request from another control unit. That is, a first control unit 350_1 in FIG. 10 may provide a measurement data packet to a second control unit 350_2 by a request from the second control unit 350_2. Likewise, the second control unit 350_2 may provide a measurement data packet to the first control unit 350_1 by a request from the first control unit 350_1.

The first control unit 350_1 or the second control unit 350_2 may use an optical cable to transmit and receive a measurement data packet.

In another embodiment, the trigger may be a request from a user. The control unit 350 may provide a measurement data packet to a user terminal according to a request from the user. In this example, the user terminal may be a computer, a notebook computer, or a mobile terminal, such as a smart phone but the inventive concept has no need to be limited thereto.

FIG. 10 shows a first data processing device 300_1 and a second data processing device 300_2. The configuration of each of the first data processing device 300_1 and the second data processing device 300_2 is the same as that in FIG. 9. However, some components have been omitted.

The first control unit 350_1 may transmit a measurement data packet from the first data processing device 300_1 to the second control unit 350_2 through a second data collection unit 340_2.

The second control unit 350_2 may transmit a measurement data packet from the second data processing device 300_2 to the first control unit 350_1 through a first data collection unit 340_1.

Figure 11:
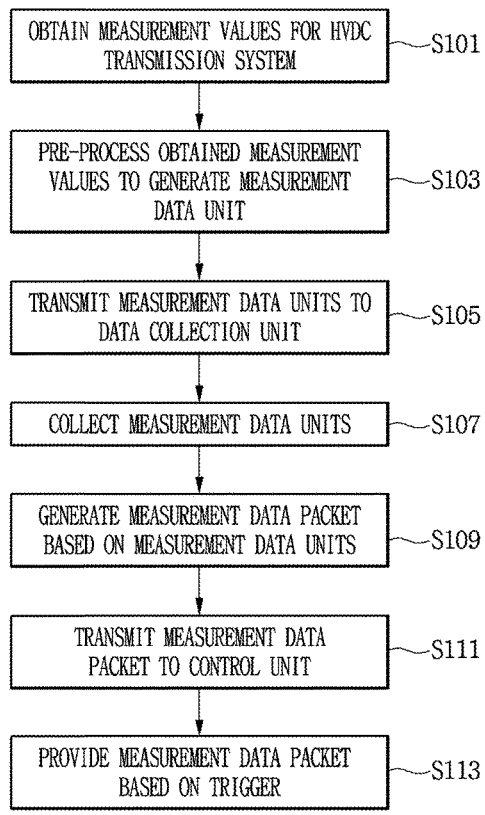
FIG. 11 is a flow chart of an operating method of a data processing device according to an embodiment.

Next, FIG. 11 is described.

FIG. 11 is a flow chart of an operating method of a data processing device according to an embodiment.

Referring to FIG. 11, the measurement module 310 of the data processing device 300 obtains measurement values for one or more points in an HVDC transmission system in step S101.

In an embodiment, the measurement module 310 may obtain measurement values for any one point in the HVDC transmission system in FIGS. 1 and 2. The measurement values may include an AC voltage for a point in the AC parts 110 and 170 and an AC current for a point in the AC parts 110 and 170. Also, the measurement values may include a DC voltage of the DC transmission part 140 and a DC current for a point in the DC transmission part 140. However, the inventive concept has no need to be limited thereto and the measurement values may include the voltage/current of the input or output terminal of a component configuring the HVDC transmission system.

The measurement module 310 may include a plurality of measurement units (not shown). Each of the plurality of measurement units may transmit measurement values to a plurality of data unit generation parts 320a to 320n.

Each of the plurality of data unit generation parts 320a to 320n uses the measurement values obtained from the measurement module 310 to generate a measurement data unit in step S103.

Each of the plurality of data unit generation parts 320a to 320n may pre-process measurement values received from the measurement module 310. Each of the plurality of data unit generation parts 320a to 320n may perform a preliminary process of removing unnecessary information from the measurement values so that a control unit 350 extracts valid values for the measurement values. Each of the plurality of data unit generation parts 320a to 320n may perform a preprocessing to generate a measurement data unit.

Each of the plurality of data unit generation parts 320a to 320n may transmit to the data collection unit 340 a measurement data unit pre-processed through the interface unit 330.

The interface unit 330 transmits, a plurality of measurement data units generated respectively from the plurality of data unit generation parts 320a to 320n, to the data collection unit 340 in step S105.

The interface unit 330 may use a backplane bus specification to transmit the measurement data unit generated from each of the plurality of data unit generation parts 320a to 320n to the data collection unit 340. The interface unit 330 may connect the plurality of data unit generation parts 320a to 320n and the data collection unit 320 to function as a path for the transmission of the measurement data unit.

The interface unit 330 may transmit the plurality of measurement data units to the data collection unit 340 through one optical cable. That is, the plurality of data unit generations parts 320a to 320n may share one optical cable.

Thus, the interface unit 330 may transmit the plurality of measurement data units through one cable in parallel. In this case, the interface unit 330 may use WDM to transmit the plurality of measurement data units to the data collection unit 340.

The data collection unit 340 collects the plurality of measurement data units transmitted through the interface unit 330 in step S107.

In an embodiment, the data collection unit 340 may simultaneously collect the plurality of measurement data units transmitted through the interface unit 330. That is, the data collection unit 340 may simultaneously collect the plurality of measurement data units through the backplane bus specification.

The data collection unit 340 may function as a buffer. That is, the data collection unit 340 may be utilized as a temporary storage temporarily storing data when data is transmitted and received between the plurality of data unit generation parts 320a to 320n and the control unit 350.

The data collection unit 340 may be named a gate module.

The data collection unit 340 generates a measurement data packet based on the plurality of measurement data units collected, in step S109.

In an embodiment, the data collection unit 340 may use the plurality of measurement data units to generate one measurement data packet.

The data collection unit 340 may code a generated measurement data packet to generate a coded measurement data packet. The data collection unit 340 may code each of the plurality of measurement data units and use a coding result to generate one measurement data packet.

The structure of the measurement data packet is described with reference to FIG. 12.

Figure 12:
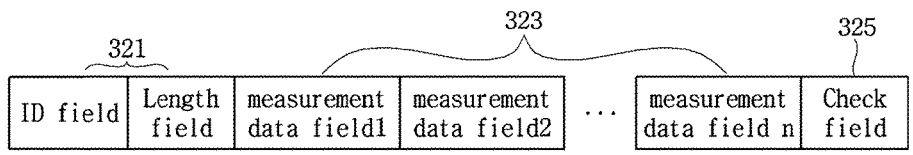
FIG. 12 is a diagram for explaining the structure of a measurement data packet according to an embodiment.

FIG. 12 is a diagram for explaining the structure of a measurement data packet according to an embodiment.

Referring to FIG. 12, the measurement data packet may include a header 321, measurement data 323 and check code 325.

The header 321 includes an identifier field and a length field.

The identifier ID field is a field identifying a measurement data packet.

The length field is a field representing the lengths of the measurement data 323 and the check code 325 following the header 321.

The header 321 may not include the header of each measurement data unit. Each measurement data unit may not include the header. Thus, the header of the measurement data packet may include only information representing a measurement data packet simply.

The header 321 is followed by the measurement data 323 and the check code 325.

The measurement data 323 includes information on the plurality of measurement values pre-processed at the data unit generation part. The measurement data 323 includes a plurality of measurement data fields 1 to n. The plurality of measurement data fields corresponds to the plurality of data unit generation parts, respectively. That is, each of the plurality of measurement data fields may represent the plurality of measurement values received from the plurality of data unit generation parts.

The measurement data 323 is followed by the check code 325.

The check code 325 is used for checking whether the measurement data packet is a reliable data unit. That is, the check code 325 may be used for checking an error in the measurement data packet. The check code 325 may be cyclic redundancy check (CRC) code, which is only an example.

In the case of the measurement data packet in FIG. 12, it is possible to decrease the number of headers compared to that in FIG. 6. That is, a plurality of data records according to the embodiment in FIG. 6 includes a plurality of headers for each pre-processing unit. However, since the measurement data packet according to the embodiment in FIG. 12 includes only one header, the embodiment in FIG. 12 may relatively decrease overhead.

According to an embodiment, since the measurement data unit transmitted from the plurality of data unit generation parts is not time-divided in transmission, there is an effect in that it is insensitive to transmission synchronization.

According to an embodiment, since the measurement data unit transmitted from the plurality of data unit generation parts is transmitted through one interface, it is possible to decrease the number of cable lines and the structure of a system is simplified.

Refer back to FIG. 11.

The data collection unit 340 transmits a generated data packet to the control unit 350 in step S111.

In an embodiment, the data collection unit 340 may uses WDM to transmit the measurement data packet to the control unit 350. The WDM indicates communicating a plurality of wavelengths through one optical fiber.

The control unit 350 provides the received measurement data packet to the outside based on a trigger in step S113.

The trigger may be synchronization initiating the transmission of the measurement data packet.

In an embodiment, the trigger may be temporal synchronization preset in the data processing device 300. The trigger may be generated at regular time intervals. That is, the control unit 350 may provide the measurement data packet to the outside at defined time intervals.

Also, the trigger may be generated at irregular time intervals. The control unit 350 may provide the measurement data packet to the outside at irregular time intervals.

In another embodiment, the trigger may be a request from another control unit. That is, a first control unit 350_1 in FIG. 10 may provide a measurement data packet to a second control unit 350_2 by a request from the second control unit 350_2. Likewise, the second control unit 350_2 may provide a measurement data packet to the first control unit 350_1 by a request from the first control unit 350_1.

The first control unit 350_1 or the second control unit 350_2 may use an optical cable to transmit and receive a measurement data packet.

In another embodiment, the trigger may be a request from a user. The control unit 350 may provide a measurement data packet to a user terminal according to a request from the user. In this example, the user terminal may be a computer, a notebook computer, or a mobile terminal, such as a smart phone but the inventive concept has no need to be limited thereto.

Figure 13:
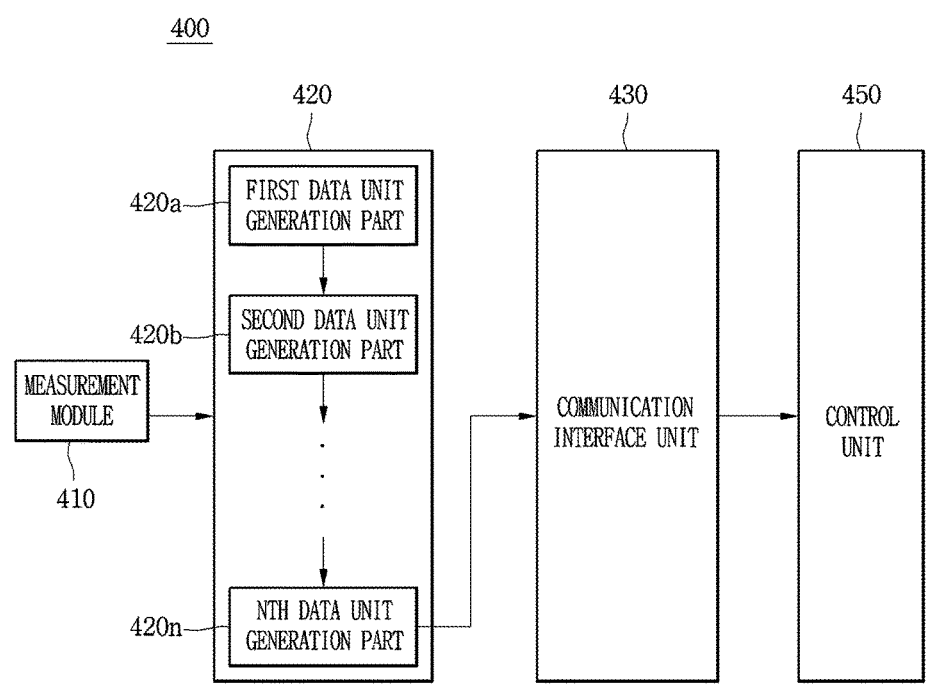
FIG. 13 is a diagram for explaining the configuration of a data processing device according to another embodiment.

FIG. 13 is a diagram for explaining the configuration of a data processing device according to another embodiment.

Referring to FIG. 13, a data processing device 400 includes a measurement module 410, a data processing and control unit 420, a communication interface unit 430, and a control unit 450.

The measurement module 410 obtains measurement values for one or more points in an HVDC transmission system. In an embodiment, the measurement module 410 may obtain measurement values for any one point in the HVDC transmission system in FIGS. 1 and 2. The measurement values may include an AC voltage for a point in the AC parts 110 and 170 and an AC current for a point in the AC parts 110 and 170. Also, the measurement values may include a DC voltage of a DC transmission part 140 and a DC current for a point in the DC transmission part 140. However, the inventive concept has no need to be limited thereto and the measurement values may include the voltage/current of the input or output terminal of a component configuring the HVDC transmission system.

The data processing and control unit 420 uses the measurement values obtained from the measurement module 410 to generate a measurement data unit.

The data processing and control unit 420 may include a plurality of data unit generation parts 420*a* to 420*n*, and each of the plurality of data unit generation parts 420*a* to 420*n* may use measurement values obtained from the measurement module 410 to generate a measurement data unit. Each of the plurality of data unit generation parts 420*a* to 420*n* may pre-process measurement values received from the measurement module 410. Each of the plurality of data unit generation parts 420*a* to 420*n* may perform a preliminary process of removing unnecessary information from the measurement values so that a control unit 450 extracts valid values for the measurement values. Each of the plurality of data unit generation parts 420*a* to 420*n* may perform a preprocessing to generate a measurement data unit.

Each of the plurality of data unit generation parts 420*a* to 420*n* may transmit the measurement data unit which it has generated, to the following data unit generation part through TDM.

The communication interface unit 430 transmits to the control unit 450 a measurement data sequence including an nth measurement data unit received from an nth data unit generation part 420*n*.

The control unit 450 codes the measurement data sequence and provides the coded measurement data sequence to the outside. The control unit 450 may use bi-phase coding to code the measurement data sequence. The bi-phase coding has been described with reference to FIG. 8, so see a corresponding section.

The control unit 350 may provide the coded measurement data sequence to the outside based on a trigger. Since the trigger has been described with reference to FIGS. 9 and 10, its detailed descriptions are omitted.

Figure 14:
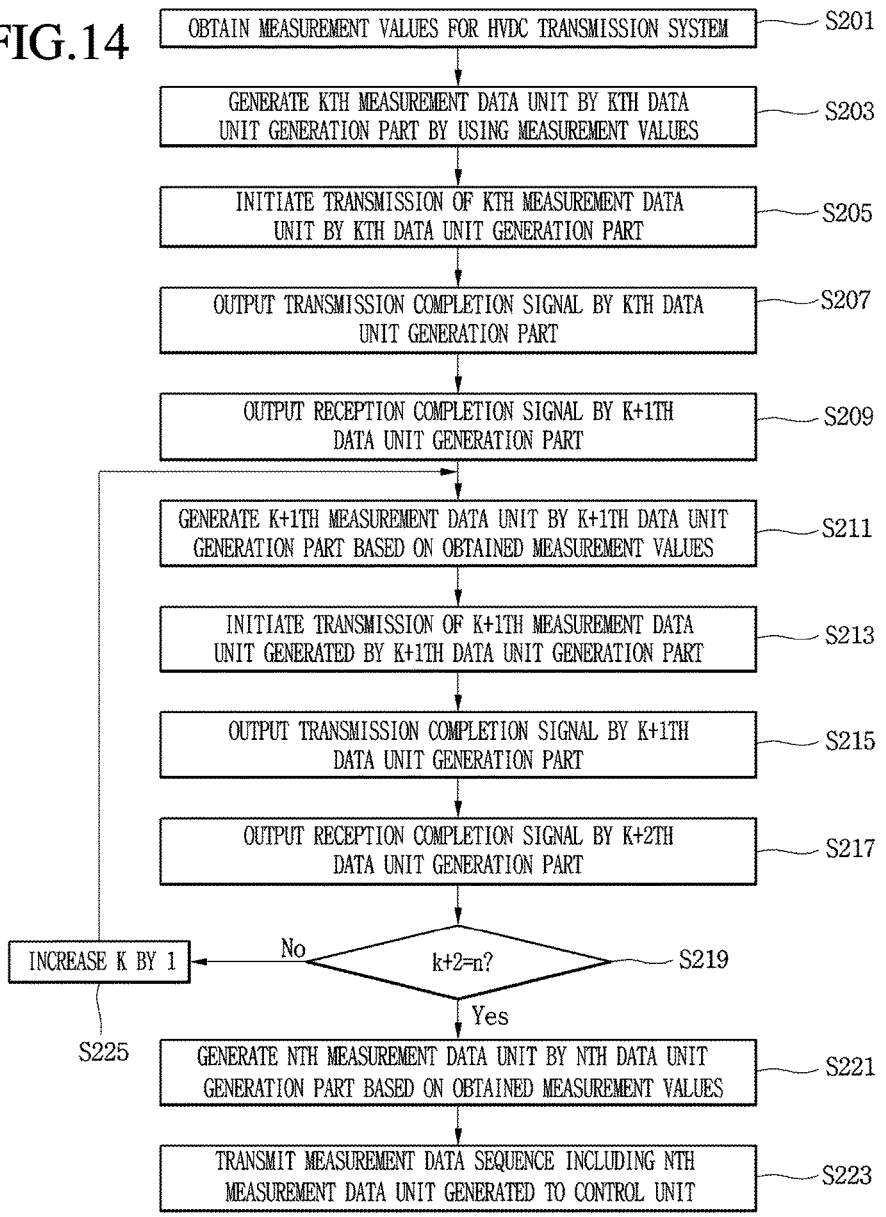
FIG. 14 is a flow chart of an operating method of a data processing device according to another embodiment.

FIG. 14 is a flow chart of an operating method of a data processing device according to another embodiment.

Referring to FIG. 14, a measurement module 410 of a data processing device 400 obtains measurement values for one or more points in an HVDC transmission system in step S201.

In an embodiment, the measurement module 410 may obtain measurement values for any one point in the HVDC transmission system in FIGS. 1 and 2. The measurement values may include an AC voltage for a point in AC parts 110 and 170 and an AC current for a point in the AC parts 110 and 170. Also, the measurement values may include a DC voltage of a DC transmission part 140 and a DC current for a point in the DC transmission part 140. However, the inventive concept has no need to be limited thereto and the measurement values may include the voltage/current of the input or output terminal of a component configuring the HVDC transmission system.

The measurement module 310 may include a plurality of measurement units (not shown). Each of the plurality of measurement units may transmit measurement values to a plurality of data unit generation parts 420*a* to 420*n*. That is, the plurality of measurement units may correspond to the plurality of data unit generation parts 420*a* to 420*n*, respectively.

A kth data unit generation part 420*k* uses measurement values obtained from the measurement module 410 to generate a kth measurement data unit in step S203. In an embodiment, k may be a natural number ranging from 1 to n-2.

A first data unit generation part 420*a* may be a master data unit generation part. When the first data unit generation part 420*a* is a master, remaining data unit generation parts may operate as slaves.

The master data unit generation part may generate a master synchronization signal and start generating a measurement data unit.

The kth data unit generation part 420$k$ initiates the transmission of the kth measurement data unit generated to a k+1th data unit generation part 420$k$+1 in step S205. In an embodiment, the kth data unit generation part 420$k$ may transmit the kth measurement data unit to the k+1th data unit generation part 420$k$+1 through an optical waveguide. The optical waveguide may be a path for transmitting the measurement data unit through an optical fiber.

The output terminal of each of the plurality of data unit generation parts may be connected to the input terminal of the following data unit generation part through the optical waveguide. Each of the plurality of data unit generation parts may transmit the measurement data unit to the input terminal of the following data unit generation part through the output terminal.

Each of the plurality of data unit generation parts may pre-process the measurement values received from the measurement unit and generate the measurement data unit.

The configuration of the kth measurement data unit is described with reference to FIG. 15.

Figure 15:
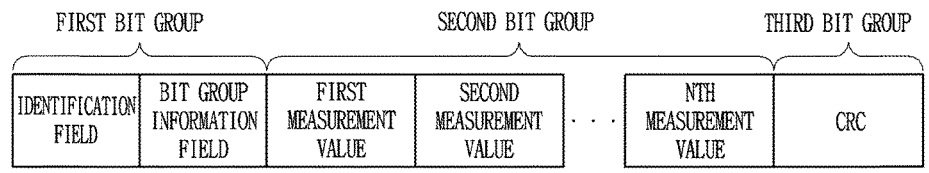
FIG. 15 is a diagram for explaining the configuration of a measurement data unit according to an embodiment.

FIG. 15 is a diagram for explaining the configuration of a measurement data unit according to an embodiment.

The measurement data unit may include a first bit group, a second bit group and a third bit group.

The first bit group includes an identification field and a bit group information field.

The identification field may be a field for identifying the measurement data unit. In particular, the identification field may include a destination identifier bit identifying a destination to which the measurement data unit is transmitted and a source identifier bit identifying who transmits the measurement data unit. Each of the destination identifier bit and the source identifier bit may be 4-bit in size but it is only an example.

The source identifier bit may have a range of 0 to 14 and the destination identifier bit may have the bits 1111, but they are only examples.

The bit group information field includes information on the second bit group following the first bit group. The bit group information field may include information on the number of a plurality of less significant bit groups in the second bit group.

The information on the number of the plurality of less significant bit groups may be used for determining at which timing the k+1th measurement data unit generation part inserts its synchronous signal and the k+1th measurement data unit after the kth measurement data unit.

The second bit group includes a plurality of measurement values obtained from the measurement unit. The second bit group includes the plurality of less significant bit groups. The plurality of less significant bit groups correspond to the plurality of measurement values, respectively. That is, each of the plurality of less significant bit groups may include information on each of the plurality of measurement values.

The third bit group may be used for checking an error in the measurement data unit. The check code 325 may be cyclic redundancy check (CRC) code, which is only an example.

Refer back to FIG. 14.

The kth data unit generation part 420K has transmitted the kth measurement data unit generated to the k+1th data unit generation part 420$k$+1 and then outputs a transmission completion signal representing that the completion of the kth measurement data unit is completed, in step S207.

In an embodiment, the transmission completion signal may be a signal being the basis for the generation start of the k+1th measurement data unit by using the kth measurement data unit by the k+1th data unit generation part 420$k$+1. Also, the transmission completion signal may be used for determining at which timing the k+1th data unit generation part 420$k$+1 has to insert its synchronous signal.

After the k+1th data unit generation part 420$k$+1 receives the transmission completion signal output from the kth data unit generation part 420$k$, it outputs a reception completion signal representing that the kth measurement data unit has been received by the k+1th data unit generation part 420$k$+1, in step S209.

That is, the k+1th data unit generation part 420$k$+1 may receive the transmission completion signal output from the kth data unit generation part 420$k$, and output a reception completion signal representing that the kth measurement data unit has been received by the k+1th data unit generation part 420$k$+1, based on the received transmission completion signal.

In an embodiment, the reception completion signal may be a signal being the basis for the generation start of the k+1th measurement data unit by the kth measurement data unit by the k+1th data unit generation part 420$k$+1. Also, the reception completion signal may be used for determining at which timing the k+1th data unit generation part 420$k$+1 has to insert its synchronization signal.

After the output of the reception completion signal, the k+1th data unit generation part 420$k$+1 generates the k+1th measurement data unit based on the measurement values obtained from the measurement module 410 in step S211.

The k+1th data unit generation part 420$k$+1 initiates the transmission of the k+1th measurement data unit generated based on the kth measurement data unit received to the k+2th data unit generation part 420$k$+2 in step S213.

The k+1th data unit generation part 420$k$+1 may insert the k+1th measurement data unit into a measurement data sequence, based on the kth measurement data unit and a synchronization signal output by the k+1th data unit generation part. That is, each of the plurality of data unit generation parts may insert a measurement data unit into a measurement data sequence through TDM.

The measurement data sequence is described with reference to FIG. 16.

Figure 16:
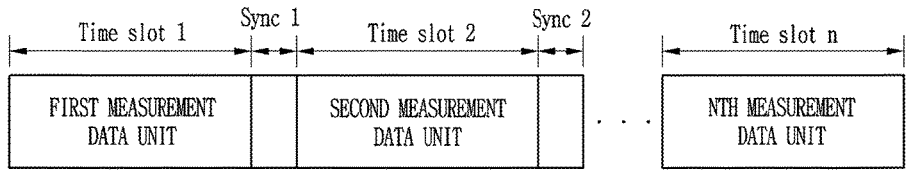
FIG. 16 shows a measurement data sequence transmitted through time division multiplexing (TDM) according to an embodiment.

FIG. 16 shows a measurement data sequence transmitted through TDM according to an embodiment.

Referring to FIG. 16, the measurement data sequence includes a plurality of time slots, a plurality of synchronization sections, and a plurality of measurement data units.

The plurality of time slots corresponds to the plurality of measurement data units, respectively. Each of the plurality of measurement data units may be inserted into a specific time slot and transmitted.

Each of the plurality of synchronization sections may be inserted before the measurement data unit generated each data unit generation part is inserted into a time slot. A synchronization signal generated before each data unit generation inserts its measurement data unit may be inserted into each of the plurality of synchronization sections.

In an embodiment, a signal corresponding to any one of the transmission completion signal and the reception completion signal output by each data unit generation part may be inserted into each of the plurality of synchronization sections. For example, a second data unit generation part 420$b$ generating a second measurement data unit may insert, a reception completion signal representing that the reception of the first measurement data unit is completed, into a first synchronization section Sync 1.

In another embodiment, a measurement data sequence may include a completion section representing a transmission completion signal or reception completion signal, apart from the synchronization section, and each data unit generation part may also insert the transmission completion signal or reception completion signal into the completion section and transmit.

Refer back to FIG. 14.

The k+1th data unit generation part 420k+1 outputs, a transmission completion signal representing that the transmission of the k+1th measurement data unit is completed, to the k+2th data unit generation part 420k+2 in step S215.

After the k+2th data unit generation part 420k+2 receives the transmission completion signal output from the k+1th data unit generation part 420k+1, it outputs a reception completion signal representing that the k+1th measurement data unit has been received by the k+2th data unit generation part 420k+2 in step S217.

Then, when k+2 is n in step S219, an nth data unit generation part 420n generates an nth measurement data unit based on obtained measurement values and the k+1th measurement data unit in step S221.

The communication interface unit 430 transmits the nth measurement data unit generated to the control unit 450 in step S223.

On the other hand, when k+2 is not n in step S219, k increases by 1 and returns to step S211.

Figure 17:
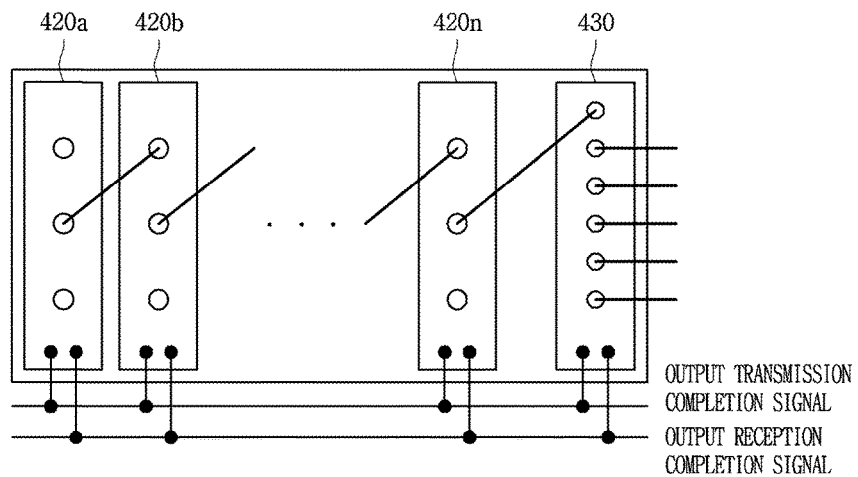
FIG. 17 shows an example of the actual configuration of a data processing device according to an embodiment.

FIG. 17 shows an example of the actual configuration of a data processing device according to an embodiment.

Referring to FIG. 17, a data processing device 400 may include a plurality of data unit generation parts 420a to 420n and a communication interface 430. Some components that have been shown in FIG. 13 have been omitted such as measurement module 410 and control unit 450.

Each of the plurality of data unit generation parts 420a to 420n may be connected in series through a daisy chain connection and transmit a measurement data unit.

For example, a first data unit generation part 420a transmits a first measurement data unit to the input terminal of a second data unit generation part 420b through the output terminal of the first data unit generation part. The input terminal of the second data unit generation part 420b transmits the second measurement data unit and a second measurement data unit to the input terminal of a third data unit generation part through the output terminal of the second data unit generation part.

The preceding data unit generation part and the following data unit generation part may be connected through an optical waveguide, through which the measurement data unit may be transmitted.

Each of the plurality of data unit generation parts 420a to 420n may insert its measurement data unit into a measurement data sequence and transmit it to the following data unit generation part, through TDM.

Each of the plurality of data unit generation parts 420a to 420n may output a reception completion signal when the reception of a measurement data unit from the preceding data unit generation part is completed, and output a transmission completion signal when the transmission of the measurement data unit to the following data unit generation part is completed.

According to an embodiment, the above-described method may also be embodied as processor readable codes on a program-recorded medium. Examples of the processor readable medium are a ROM, a RAM, a CD-ROM, a magnetic tape, a floppy disk, and an optical data storage device, and the method is also implemented in the form of a carrier wave (such as data transmission through the Internet).

According to various embodiments, it is possible to decrease sensitivity to transmission synchronization even when the measurement data unit is transmitted through TDM.

Also, it is possible to decrease the number of optical cables through serial transmission and there is an effect in that the structure of a system is simplified.

The above-described embodiments are not limited to the above-described configuration and method, and some or all of the embodiments may also be selectively combined so that various variations may be implemented.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A data processing device in a high voltage direct current (HVDC) transmission system, the data processing device comprising:

at least one measurement module configured to measure a voltage or current at one or more points in the HVDC system; and a data generation module, wherein the data generation module includes a first data generation part and a second data generation part, wherein the first data generation part and the second data generation part are two of a plurality of data generation parts, each of the plurality of data generation parts being connected in series through a daisy chain to a communication interface, wherein the communication interface is connected to a control unit, the first data generation part having a first input terminal and a first output terminal, wherein the first input terminal receives data from the at least one measurement module;

the second data generation part having a second input terminal and a second output terminal, wherein the first output terminal is connected to the second input terminal via an optical waveguide;

wherein the first data generation part generates a first measurement data unit and a master synchronization signal, and the second data generation part generates a second measurement data unit using measurement values measured by the at least one measurement module, wherein the master synchronization signal is used to start data transmission to the control unit, and the first measurement data unit and the second measurement data unit are sent to the control unit by serial transmission of the first and second generated measurement data units via time division multiplexing (TDM) without time-dividing the generated measurement data units, wherein each of the first and second data generation parts outputs a transmission completion signal indicating transmission of a corresponding one of the generated measurement data units is completed, wherein the control unit provides the received first measurement data unit and the second measurement data unit to an external source based on a trigger, wherein the trigger is at least one of a regular time interval, an irregular time interval, and a request from the external source.

2. The data processing device according to claim 1, wherein the first data unit generation part and the second data unit generation part further output the transmission completion signal after transmitting the corresponding generated measurement data unit to a third data unit generation part.

3. The data processing device according to claim 2, wherein each of the first, second, and third data unit generation parts further outputs a reception completion signal after receiving the first generated measurement data unit, the second generated measurement data unit, and a third generated measurement data unit.

4. The data processing device according to claim 3, wherein each transmission completion signal and reception completion signal is a basis for starting generation of the first generated measurement data unit, the second generated measurement data unit, and the third generated measurement data unit.

5. The data processing device according to claim 3, wherein each transmission completion signal and reception completion signal is used by the first, second and third data unit generation parts to determine a time at which to insert a corresponding synchronization signal.

6. The data processing device according to claim 1, wherein the first and second generated measurement data units comprises:
   a first bit group comprising information identifying the first or second measurement data unit and information related to a second bit group;
   the second bit group representing a corresponding measurement value; and
   a third bit group for error checking the first or second measurement data unit.

7. The data processing device according to claim 6, wherein:
   the first bit group further comprises an identification field and a bit group information field;
   the identification field comprises a destination identifier bit identifying a destination to which the first or second measurement data unit is transmitted and a source identifier bit identifying an entity that transmits the first or second measurement data unit; and
   the bit group information field comprises information related to a number of a plurality of less significant bit groups in the second bit group.

8. The data processing device according to claim 7, wherein each of the first and second data unit generation parts further determines an insertion time of the corresponding measurement data unit based on the information related to the number of the plurality of less significant bit groups.

9. The data processing device according to claim 6, wherein the third bit group represents a cyclic redundancy check (CRC).

* * * * *